(12) United States Patent
Warntjes

(10) Patent No.: US 7,973,530 B2
(45) Date of Patent: Jul. 5, 2011

(54) MRI DISPLAY WITH CONTRAST NAVIGATION WINDOW

(76) Inventor: Jan Bertus Marten Marcel Warntjes, Ljungsbro (SE)

( * ) Notice: Subject to any disclaimer, the term of this patent is extended or adjusted under 35 U.S.C. 154(b) by 189 days.

(21) Appl. No.: 12/429,351

(22) Filed: Apr. 24, 2009

(65) Prior Publication Data

US 2009/0267599 A1    Oct. 29, 2009

Related U.S. Application Data

(60) Provisional application No. 61/047,896, filed on Apr. 25, 2008.

(51) Int. Cl.
*G01V 3/00*    (2006.01)
(52) U.S. Cl. ......................... 324/309; 324/318
(58) Field of Classification Search .................. 324/309, 324/318, 322
See application file for complete search history.

(56) References Cited

U.S. PATENT DOCUMENTS

| | | | | |
|---|---|---|---|---|
| 5,803,914 | A * | 9/1998 | Ryals et al. | 600/407 |
| 6,888,350 | B2 * | 5/2005 | Deimling | 324/309 |
| 7,633,501 | B2 * | 12/2009 | Wood et al. | 345/419 |
| 7,671,592 | B2 * | 3/2010 | Kabasawa | 324/309 |
| 7,683,621 | B1 * | 3/2010 | Zur | 324/309 |

FOREIGN PATENT DOCUMENTS

WO    2008/082341 A1    7/2008

* cited by examiner

*Primary Examiner* — Louis M Arana
(74) *Attorney, Agent, or Firm* — Potomac Patent Group PLLC

(57) ABSTRACT

In a method of displaying settings for a Magnetic Resonance (MR) image, a visual marker is displayed in a window. The coordinates of the visual marker correspond to T1 weighting of the MR image along a first axis of a display and correspond to T2 weighting of the MR image along a second axis of a display window.

21 Claims, 2 Drawing Sheets

MRI DISPLAY WITH CONTRAST NAVIGATION WINDOW

TECHNICAL FIELD

The present invention relates to a method and an apparatus for displaying MRI images. In particular the present invention relates to displaying settings for a Magnetic Resonance MR image.

BACKGROUND

Magnetic Resonance Imaging commonly abbreviated MRI is mainly a qualitative modality. That means that images have an arbitrary scaling and only the intensity differences between tissues, the contrast, are important. Conventional MRI imaging systems mostly use T1-weighted (T1W) and the T2-weighted (T2W) contrast images that utilize differences in the absolute T1 and T2 relaxation, respectively. The values for T1 and T2 relaxation are characteristic for each tissue.

If there is no T1W or T2W contrast in an image it will only reflect the proton density of all tissues; this contrast is called Proton Density Weighted (PDW).

Image contrast is mainly controlled by three MR scanner setting, namely the Echo Time TE, the Repetition Time TR and the Flip Angle $\alpha$. Equations can be set up to define how much T1- or T2 weighted an image becomes using a certain scanner parameter setting.

Typically a short TR leads to a T1W contrast whereas a long TE leads to a T2W contrast. The combination of a long TR and a short TE leads to a PDW image.

An existing method and system for visualizing MRI images are described in the international patent publication no. WO 2008/082341 A1 which is incorporated herein by reference.

There is a constant desire to improve methods for visualizing MRI images.

SUMMARY

It is an object of the present invention to provide an improved method of visualizing MRI images and also to provide an apparatus and a computer program for performing the visualizing.

This object and others are obtained by the method and apparatus as set out in the appended claims. Thus, when displaying settings for a Magnetic Resonance MR image a visual marker (M) is displayed in a window. The coordinates of the visual marker corresponds to T1 weighting of the MRI image along a first axis of a display and T2 weighting of the MRI image along a second axis of a display window.

In accordance with one embodiment the coordinates for the visual Marker is calculated using the MR parameters of the MR image, in particular TE, TR and flip angle.

In accordance with one embodiment the window with the visual marker is displayed simultaneously with the MR image.

In accordance with one embodiment the window with the visual marker is displayed on the same screen as the MR image.

In accordance with one embodiment an indication what is considered normal T1 weighting, normal T2 weighting and normal PD weighting is shown in the window with the visual marker.

BRIEF DESCRIPTION OF THE DRAWINGS

The present invention will now be described in more detail by way of non-limiting examples and with reference to the accompanying drawings, in which.

DETAILED DESCRIPTION

Figure 1:
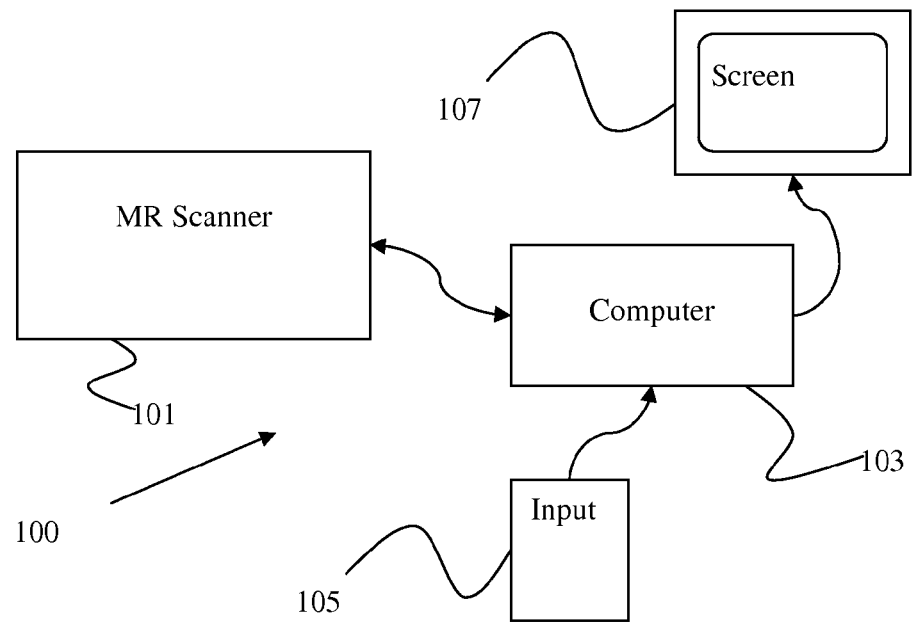
FIG. 1 is a general view of a MRI system.

In FIG. 1 a general view of a setup of a MRI system 100 is depicted. The system 100 comprises a MR scanner 101. The MR scanner is operative to generate MRI data by means of scanning a living object. The MR scanner is further connected to a computer 103 for processing data generated by the scanner 101. The computer comprises a central processor unit coupled to a memory and a number of input and output ports for receiving and outputting data and information. The computer 103 receives input commands from one or several input devices generally represented by an input device 105. The input device may be one or many of a computer mouse, a keyboard, a track ball or any other input device. The computer 103 is further connected to a screen 107 for visualizing the processed scanner data as a contrast image. The MRI system can be made to operate and display images in response to a computer program loaded into the memory of the system and executed by the computer. The computer program can be stored on any suitable storage media such as a ROM, a disc or similar.

In accordance with one exemplary embodiment image weighting for typical MR images can be defined on a scale between 0 and 1 by using the following equations:

$$W1 = 1 - \exp(-\sin(\alpha) * TR/1000);$$

$$W2 = \exp(-TE/100);$$

where the W1 depends on $\alpha$ and TR and W2 depends on TE. These equations have no quantitative meaning but are indicative of the T1 weighting and the T2 weighting. Better equations can be found that take the mean or median value of the absolute T1 and T2 relaxation of the images into account, if these values are available.

In accordance with the present invention a user is presented with an MR image and a contrast navigation window. The MR image and the contrast navigation window can in accordance with one embodiment be displayed on a common screen or in accordance with another embodiment on different screens. The image settings of the MR image (TE, TR and $\alpha$) are translated into the coordinates W1 and W2. A visual marker M indicates the present contrast weighting of the presented MR image.

The contrast navigation window can be used as a visual support for the user to show the current image weighting of the image that is activated. This becomes especially important for so-called Synthetic MRI where any T1 and T2 weighted image can be generated based on an absolute measurement of T1 and T2 relaxation and Proton Density.

In synthetic MRI an MR image is synthesized using a specific combination of TE, TR and $\alpha$. Simultaneously the marker indicates the corresponding W1-W2 coordinate. If a user changes the TE-TR-$\alpha$ setting for the synthesis, the marker will be updated accordingly enabling the user to obtain a quick view of the current settings.

Figure 2:
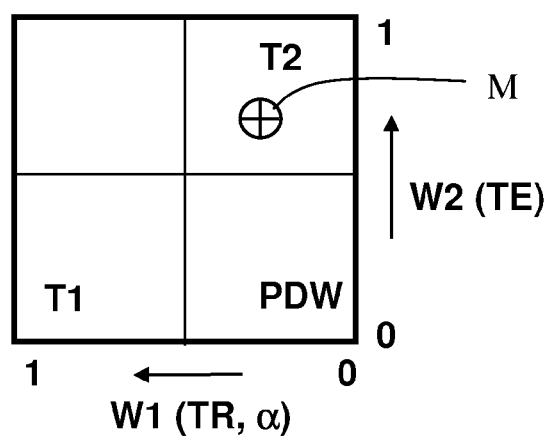
FIG. 2 is a an example of displaying settings for a Magnetic Resonance (MR) image.

In FIG. 2 an exemplary screen is shown. On the horizontal axis the W1 value is shown between 0 and 1, controlled by TR and α. On the vertical axis the W2 value is shown between 0 and 1, controlled by TE.

An image is T1 weighted if the values of W1 and W2 lie in the lower-left corner.

An image is T2 weighted if the values of W1 and W2 lie in the upper-right corner.

An image is PD weighted if the values of W1 and W2 lie in the lower-right corner.

The scanner settings TE, TR and α can be retrieved directly from the scanner or from the image information header, such as Dicom tags, which an international standard for storage of digital images or from the image synthesis.

In the example shown in FIG. 2 the visual marker M indicates a T2 weighted image.

Figure 3:
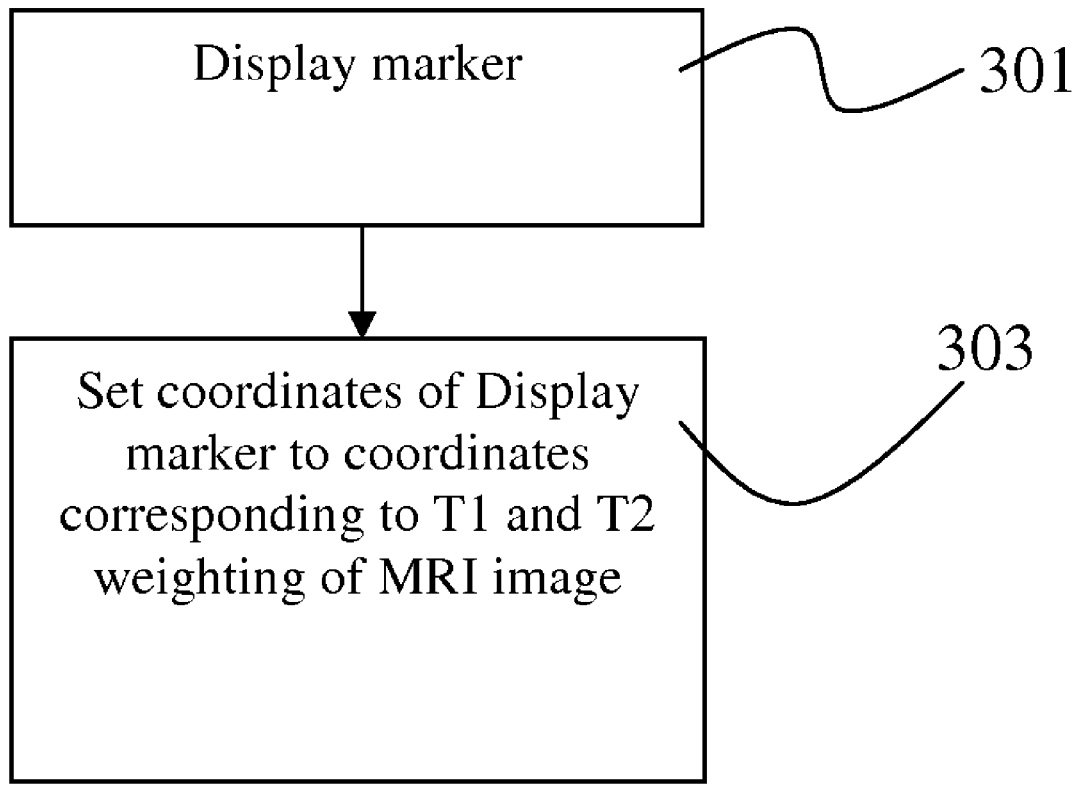
FIG. 3 is a flow chart illustrating some procedural steps performed when displaying settings for a Magnetic Resonance (MR) image.

In FIG. 3 a flow chart illustrating some procedural steps performed when displaying settings for a Magnetic Resonance MR image in accordance with the above is shown. First, in a step 301, a marker is displayed in a window. Next, in a step 303, the coordinates of the visual marker are set to correspond to T1 weighting of the MRI image along a first axis of a display and to T2 weighting of the MRI image along a second axis of a display window.

In accordance with another embodiment of the present invention a user is presented with an MR image and the contrast navigation window. Again in accordance with one embodiment be displayed on a common screen or in accordance with another embodiment on different screens. The MR image is calculated, or synthesized, based on previously measured T1 and T2 relaxation and proton density, using the approach of Synthetic MRI. By means of a mouse movement or a similar input the user can change the position of the marker inside the plot. This corresponds to another coordinate of W1 and W2. In response to such a movement of the position of the marker M, the MR image is updated accordingly by changing TE, TR and α for the displayed MR image. This will help the user in finding the desired contrast of the synthetic MR image.

What is claimed is:

1. A method of displaying settings for a Magnetic Resonance (MR) image, wherein a visual marker is displayed in a window, where coordinates of the visual marker correspond to T1 weighting of the MR image along a first axis of the window and correspond to T2 weighting of the MR image along a second axis of the window.

2. The method of claim 1, wherein the coordinates of the visual marker are calculated using the MR parameters of the MR image, and the MR parameters include at least one of echo time (TE), repetition time (TR), and flip angle.

3. The method of claim 1, wherein the window with the visual marker is displayed simultaneously with the MR image.

4. The method of claim 3, wherein the window with the visual marker is displayed on the same screen as the MR image.

5. The method of claim 1, wherein an indication of normal T1 weighting, normal T2 weighting and normal PD weighting is shown in the window with the visual marker.

6. The method of claim 1, wherein the position of the visual marker is controlled by a user via an input device.

7. The method of claim 6, wherein a movement of the visual marker causes echo time (TE), repetition time (TR), and flip angle α to change for the displayed MR image.

8. An apparatus for displaying settings for a Magnetic Resonance (MR) image adapted to display a visual marker in a window, the apparatus further being adapted to set coordinates of the visual marker to correspond to T1 weighting of the MR image along a first axis of the window and to correspond to T2 weighting of the MRI image along a second axis of the window.

9. The apparatus of claim 8, wherein the apparatus is adapted to calculate coordinates for the visual marker using MR parameters of the MR image, and the MR parameters include at least one of echo time (TE), repetition time (TR), and flip angle.

10. The apparatus of claim 8, wherein the apparatus is adapted to display the window with the visual marker simultaneously with the MR image.

11. The apparatus of claim 10, wherein apparatus is adapted to display the window with the visual marker on the same screen as the MR image.

12. The apparatus of claim 8, wherein the apparatus is adapted to display an indication of normal T1 weighting, normal T2 weighting, and normal PD weighting in the window with the visual marker.

13. The apparatus of claim 1, wherein the apparatus is adapted to receive the position of the visual marker as a control signal from a user via an input device.

14. The apparatus of claim 13, wherein the apparatus is adapted to cause echo time (TE), repetition time (TR), and flip angle α to change for the displayed MR image in response to a movement of the visual marker.

15. A storage medium for storing a computer program, where the computer program comprises computer program segments that when executed on a computer cause the computer to display a visual marker displaying settings for a Magnetic Resonance (MR) image in a window, where coordinates of the visual marker correspond to T1 weighting of the MR image along a first axis of the window and correspond to T2 weighting of the MR image along a second axis of the window.

16. The medium of claim 15, wherein the coordinates for the visual marker are calculated using MR parameters of the MR image, and the MR parameters include at least one of echo time (TE), repetition time (TR), and flip angle.

17. The medium of claim 15, wherein the window with the visual marker is displayed simultaneously with the MR image.

18. The medium of claim 17, wherein the window with the visual marker is displayed on the same screen as the MR image.

19. The medium of claim 15, wherein an indication of normal T1 weighting, normal T2 weighting, and normal PD weighting is shown in the window with the visual marker.

20. The medium of claim 15, wherein the position of the visual marker is controlled by a user via an input device.

21. The medium of claim 20, wherein a movement of the visual marker causes echo time (TE), repetition time (TR), and flip angle α to change for the displayed MR image.

* * * * *